(12) United States Patent
Worledge

(10) Patent No.: US 7,894,247 B2
(45) Date of Patent: *Feb. 22, 2011

(54) SCALABLE MAGNETIC RANDOM ACCESS MEMORY DEVICE

(75) Inventor: Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 290 days.

This patent is subject to a terminal disclaimer.

(21) Appl. No.: 12/119,297

(22) Filed: May 12, 2008

(65) Prior Publication Data

US 2008/0212365 A1 Sep. 4, 2008

Related U.S. Application Data

(63) Continuation of application No. 11/481,541, filed on Jul. 6, 2006, now Pat. No. 7,433,225.

(51) Int. Cl.
*G11C 11/00* (2006.01)
(52) U.S. Cl. .................. 365/158; 365/171; 365/173
(58) Field of Classification Search .................. 365/158, 365/171, 173
See application file for complete search history.

(56) References Cited

U.S. PATENT DOCUMENTS

| 6,545,906 B1 | 4/2003 | Savtchenko et al. |
| 7,227,773 B1 * | 6/2007 | Nguyen et al. ............... 365/158 |
| 7,230,845 B1 | 6/2007 | Wang et al. |
| 7,433,225 B2 * | 10/2008 | Worledge .................... 365/158 |
| 2008/0259674 A1* | 10/2008 | Worledge .................... 365/158 |
| 2008/0259675 A1* | 10/2008 | Worledge .................... 365/158 |

* cited by examiner

*Primary Examiner*—Pho M Luu
(74) *Attorney, Agent, or Firm*—Vazken Alexanian; Michael J. Chang, LLC

(57) ABSTRACT

A magnetic memory cell is provided. The magnetic memory cell includes at least one fixed magnetic layer and a plurality of free magnetic layers, separated from the at least one fixed magnetic layer by at least one barrier layer. The free magnetic layers include a first free magnetic layer adjacent to the barrier layer, a second free magnetic layer separated from the first free magnetic layer by at least one spacer layer, and a third free magnetic layer separated from the second free magnetic layer by at least one anti-parallel coupling layer. A magnetic moment of the first free magnetic layer is greater than both a magnetic moment of the second free magnetic layer and a magnetic moment of the third free magnetic layer. The magnetic memory cell may be used in conjunction with a magnetic random access memory device.

13 Claims, 12 Drawing Sheets

Write "0"
Starting "1"

Write "1"
Starting "1"

Easy Axis

Hard Axis

SCALABLE MAGNETIC RANDOM ACCESS MEMORY DEVICE

CROSS-REFERENCE TO RELATED APPLICATION(S)

This application is a continuation of U.S. application Ser. No. 11/481,541 filed on Jul. 6, 2006 now U.S. Pat. No. 7,433,225, the disclosure of which is incorporated by reference herein.

FIELD OF THE INVENTION

The present invention relates to data storage, and more particularly, to data storage devices and techniques for use thereof.

BACKGROUND OF THE INVENTION

Semiconductor devices, such as magnet random access memory (MRAM) devices, use magnetic memory cells to store information. Information is stored in the magnetic memory cells as an orientation of the magnetization of a free layer in the magnetic memory cell as compared to an orientation of the magnetization of a fixed (e.g., reference) layer in the magnetic memory cell. The magnetization of the free layer can be oriented parallel or anti-parallel relative to the fixed layer, representing either a logic "1" or a logic "0." The orientation of the magnetization of a given layer (fixed or free) may be represented by an arrow pointing either to the left or to the right. When the magnetic memory cell is sitting in a zero applied magnetic field, the magnetization of the magnetic memory cell is stable, pointing either left or right. The application of a magnetic field can switch the magnetization of the free layer from left to right, and vice versa, to write information to the magnetic memory cell.

One of the objectives of MRAM is to have a low operating power and small area. This objective requires a low switching field for the magnetic memory cell, because a low switching field uses a low switching current, which uses less power, and because smaller currents require smaller switches, which occupy less space. However, as the area of the magnetic memory cells becomes increasingly smaller, a process referred to as "scaling" due to the fact that the area of the magnetic memory cell is scaled down to allow for more magnetic memory cells in the same area, the switching field actually increases.

U.S. Pat. No. 6,545,906 issued to Savtchenko, et al., entitled "Method of Writing to Scalable Magnetoresistance Random Access Memory Element" (hereinafter "Savtchenko") describes a toggle free layer for use in MRAM devices. Prior to Savtchenko, MRAM devices employed a single free layer design. Both of these approaches, however, are prone to the problems associated with scaling that are described above. Namely, as the size of the magnetic memory cell is scaled down, an increased amount of power is required to switch the magnetic memory cell. For example, as much as 80 Oersteds (Oe) can be required to switch a 150 nanometer (nm) toggle magnetic memory cell.

Thus, scalable magnetic memory devices having reduced switching fields would be desirable.

SUMMARY OF THE INVENTION

The present invention provides techniques for reducing the switching fields in magnetic memory devices. In one aspect of the invention, a magnetic memory cell is provided. The magnetic memory cell comprises at least one fixed magnetic layer and a plurality of free magnetic layers, separated from the at least one fixed magnetic layer by at least one barrier layer. The free magnetic layers include a first free magnetic layer adjacent to the barrier layer, a second free magnetic layer separated from the first free magnetic layer by at least one spacer layer, and a third free magnetic layer separated from the second free magnetic layer by at least one anti-parallel coupling layer. A magnetic moment of the first free magnetic layer is greater than both a magnetic moment of the second free magnetic layer and a magnetic moment of the third free magnetic layer.

In another aspect of the invention, a magnetic random access memory (MRAM) device is provided. The MRAM device comprises a plurality of word lines oriented orthogonal to a plurality of bit lines, and a plurality of magnetic memory cells configured in an array between the word lines and bit lines. At least one of the plurality of magnetic memory cells comprises at least one fixed magnetic layer, and a plurality of free magnetic layers, separated from the at least one fixed magnetic layer by at least one barrier layer. The free magnetic layers include a first free magnetic layer adjacent to the barrier layer, a second free magnetic layer separated from the first free magnetic layer by at least one spacer layer, and a third free magnetic layer separated from the second free magnetic layer by at least one anti-parallel coupling layer. A magnetic moment of the first free magnetic layer is greater than both a magnetic moment of the second free magnetic layer and a magnetic moment of the third free magnetic layer.

In yet another aspect of the invention, a method of writing data to an MRAM device having a plurality of word lines oriented orthogonal to a plurality of bit lines, and a plurality of magnetic memory cells configured in an array between the word lines and bit lines, comprises the following steps. A word line current is provided to a given one of the word lines to select all of the magnetic memory cells along the given word line. At least one of the selected magnetic memory cells comprises at least one fixed magnetic layer and a plurality of free magnetic layers, separated from the at least one fixed magnetic layer by at least one barrier layer. The free magnetic layers include a first free magnetic layer adjacent to the barrier layer, a second free magnetic layer separated from the first free magnetic layer by at least one spacer layer, and a third free magnetic layer separated from the second free magnetic layer by at least one anti-parallel coupling layer. A magnetic moment of the first free magnetic layer is greater than both a magnetic moment of the second free magnetic layer and a magnetic moment of the third free magnetic layer. A bit line current is provided to each of the bit lines corresponding to the selected magnetic memory cells. The word line current is removed. The bit line current is removed.

In still another aspect of the invention, a magnetic memory cell is provided. The magnetic memory cell comprises at least one fixed magnetic layer, and a plurality of free magnetic layers, separated from the at least one fixed magnetic layer by at least one barrier layer. The free magnetic layers include a first free magnetic layer adjacent to the barrier layer, a second free magnetic layer separated from the first free magnetic layer by at least one first parallel coupling layer, and a third free magnetic layer separated from the second free magnetic layer by at least one second parallel coupling layer. A magnetic moment of the second free magnetic layer is greater than both a magnetic moment of the first free magnetic layer and a magnetic moment of the third free magnetic layer.

A more complete understanding of the present invention, as well as further features and advantages of the present invention, will be obtained by reference to the following detailed description and drawings.

DETAILED DESCRIPTION OF PREFERRED EMBODIMENTS

Figure 1:
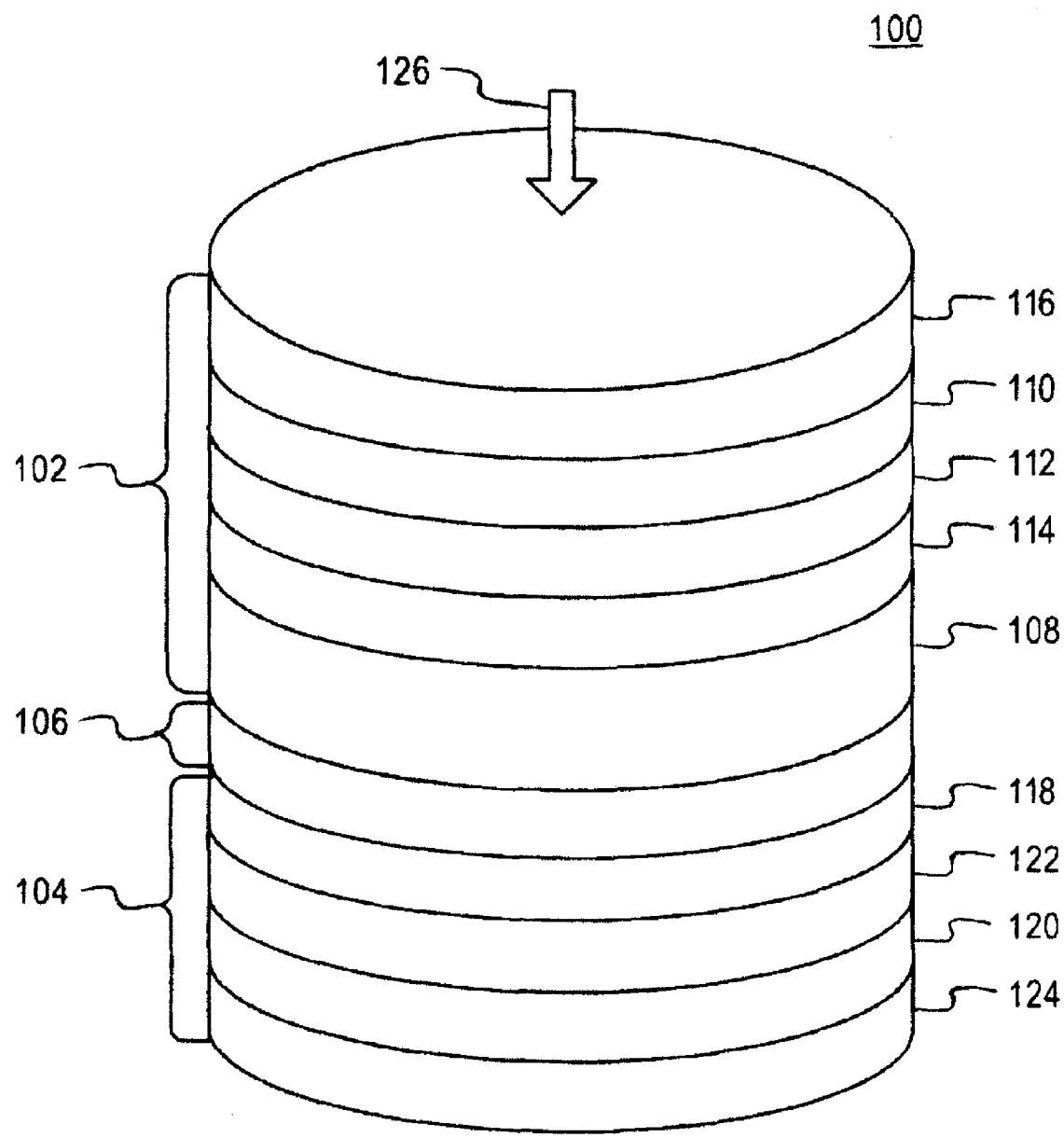
FIG. 1 is a diagram illustrating an exemplary magnetic memory cell according to an embodiment of the present invention.

FIG. 1 is a diagram illustrating exemplary magnetic memory cell 100. Magnetic memory cell 100 comprises tunnel barrier 106 deposited on fixed layer 104, and free layer 102 deposited on tunnel barrier 106.

According to the exemplary embodiment depicted in FIG. 1, magnetic memory cell 100 can be configured, i.e., patterned, to have, when viewed from top-down view 126, a circular (or elliptical) shape. See also the top-down depictions of magnetic memory cell 100 having a circular shape in FIGS. 3A-B, described below. It is to be understood, however, that any other patternable shapes and/or configurations can be employed in accordance with the present teachings. As will be described in detail below, magnetic memory cell 100 may be used in conjunction with a magnetic random access memory (MRAM) device.

As shown in FIG. 1, free layer 102 is a multiple-layer structure. Namely, free layer 102 comprises magnetic layer 108 adjacent to tunnel barrier 106. Spacer layer 114 is deposited on a side of magnetic layer 108 opposite tunnel barrier 106. Magnetic layer 112 is deposited on a side of spacer layer 114 opposite magnetic layer 108. Anti-parallel coupling (AP-coupling) layer 110 is deposited on a side of magnetic layer 112 opposite spacer layer 114. Finally, magnetic layer 116 is deposited on a side of AP-coupling layer 110 opposite magnetic layer 112.

Each of magnetic layers 108, 112 and 116 can comprise any suitable ferromagnetic material, including, but not limited to, one or more of a nickel/iron alloy (NiFe alloy) and alloys containing one or more of Ni, Fe, Cobalt (Co) and a rare earth element. Further, any one of magnetic layers 108, 112 and 116 can have a same, or a different, composition as any of the other magnetic layers 108, 112 and 116. For example, according to one exemplary embodiment, all three magnetic layers 108, 112 and 116 comprise the same NiFe alloy.

Each of magnetic layers 108, 112 and 116 has a magnetic moment $\mu$ associated therewith, wherein $\mu$ equals the product of a magnetization of the layer $M_s$, a thickness of the layer T and an area of the layer A, i.e., $$\mu = M_s \cdot T \cdot A. \tag{1}$$

As will be described below, $\mu$ points in a particular direction, i.e., a direction of magnetization. Magnetic layers 108, 112 and 116 have magnetic moments $\mu_1$, $\mu_2$, and $\mu_3$, respectively, associated therewith. According to the present teachings, $\mu_1$ is greater than both $\mu_2$ and $\mu_3$, i.e., $\mu_1 > \mu_2$ and $\mu_1 > \mu_3$. Further, according to one exemplary embodiment, $\mu_2$ is equal to $\mu_3$, i.e., $\mu_2 = \mu_3$.

When magnetic layers 108, 112 and 116 are configured to have a circular shape, as described above, it can be assumed that each of magnetic layers 108, 112 and 116 occupies the same area, i.e., magnetic layers 108, 112 and 116 have areas $A_1$, $A_2$ and $A_3$, respectively, associated therewith wherein $A_1 = A_2 = A_3$. Further, when magnetic layers 108, 112 and 116 have the same composition, as described above, it can be assumed that each of magnetic layers 108, 112 and 116 has the same magnetization, i.e., magnetic layers 108, 112 and 116 have magnetizations $M_{s1}$, $M_{s2}$ and $M_{s3}$, respectively, associated therewith wherein $M_{s1} = M_{s2} = M_{s3}$. Accordingly, when both of the above conditions apply, i.e., when magnetic layers 108, 112 and 116 are circular and each layer has the same composition, T is the sole variable in $\mu$ differences between the layers. According to this exemplary embodiment, magnetic layer 108 is adapted to have a greater thickness than either magnetic layer 112 or magnetic layer 116, i.e., magnetic layers 108, 112 and 116 have thicknesses $T_1$, $T_2$ and $T_3$, respectively, associated therewith wherein $T_1 > T_2$ and $T_1 > T_3$. See, for example, FIG. 1. Further, according to one exemplary embodiment, magnetic layer 112 has the same thickness as magnetic layer 116, i.e., $T_2 = T_3$.

Magnetic layers 108 and 112 are separated by spacer layer 114. Spacer layer 114 mediates zero coupling between magnetic layers 108 and 112. According to an exemplary embodiment, spacer layer 114 comprises one or more of tantalum nitride (TaN), Ta, titanium (Ti), tungsten (W) and niobium (Nb). Materials that can give zero coupling, such as ruthenium (Ru), can also be used if the thickness of the layer is adjusted to give zero coupling.

Magnetic layers 112 and 116 are separated by AP-coupling layer 110. AP-coupling layer 110 mediates anti-parallel magnetic coupling between magnetic layers 112 and 116. According to an exemplary embodiment, AP-coupling layer 110 comprises one or more of Ru, osmium (Os), copper (Cu), chromium (Cr), molybdenum (Mo), rhodium (Rh), rhenium (Re) and iridium (Ir).

As described above, tunnel barrier 106 separates free layer 102 from fixed layer 104. Tunnel barrier 106 comprises any suitable tunnel barrier material, including, but not limited to, one or more of aluminum oxide (AlOx) and magnesium oxide (MgO).

As shown in FIG. 1, fixed layer 104 can also be a multiple-layer structure. Namely, fixed layer 104 comprises magnetic layer 118 adjacent to tunnel barrier 106 and separated from magnetic layer 120 by AP-coupling layer 122. Anti-ferromagnetic (AF) layer 124 is adjacent to a side of magnetic layer 120 opposite AP-coupling layer 122.

Each of magnetic layers 118 and 120 can comprise any suitable ferromagnetic material, including, but not limited to, one or more of an alloy containing Ni, Fe or Co, and can have a same, or a different, composition as the other of magnetic layers 118 and 120. AP-coupling layer 122 mediates anti-parallel magnetic coupling between magnetic layers 118 and 120, and can comprise one or more of Ru, Os, Cu, Cr, Mo, Rh, Re and Ir.

AF layer 124 serves to pin the direction of magnetization of magnetic layers 118 and 120. AF layer 124 can comprise a metal alloy, including, but not limited to, one or more of a platinum/manganese alloy (PtMn) and an iridium/manganese alloy (IrMn).

While FIG. 1 depicts magnetic memory cell 100 as having tunnel barrier 106 being deposited on top of fixed layer 104 and free layer 102 being deposited on top of tunnel barrier 106, this configuration is merely exemplary, and other configurations can be employed. By way of example only, the layers may be deposited in the reverse order to that shown in FIG. 1, i.e., with tunnel barrier 106 being deposited on top of free layer 102 and fixed layer 104 being deposited on top of tunnel barrier 106, so long as the free magnetic layer having the greatest magnetic moment (e.g., magnetic layer 108) is adjacent to tunnel barrier 106.

Figure 2:
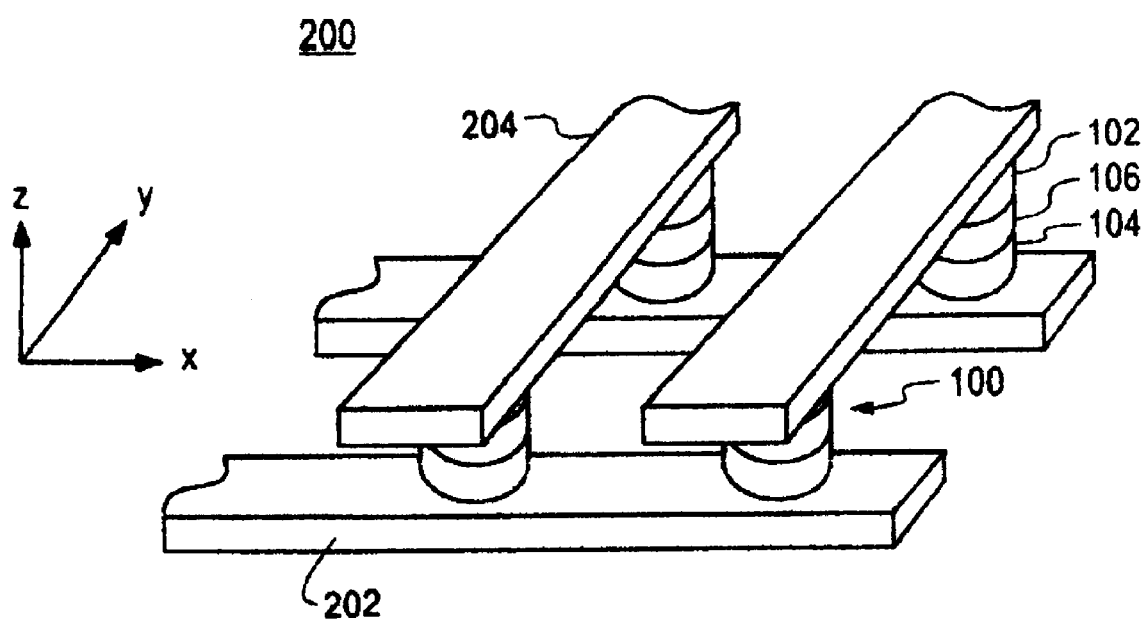
FIG. 2 is a diagram illustrating an exemplary magnetic memory cell array according to an embodiment of the present invention.

FIG. 2 is a diagram illustrating exemplary magnetic memory cell array 200. Magnetic memory cell array 200 can be employed as an MRAM device.

Magnetic memory cell array 200 comprises bit lines 202 and word lines 204 running orthogonal to each other above and below a plurality of magnetic memory cells 100. The configuration of magnetic memory cell array 200 shown in FIG. 2 is merely exemplary, and other configurations are possible. By way of example only, magnetic memory cell array 200 can be configured to have bit lines 202 run below magnetic memory cells 100 and word lines 204 run above magnetic memory cells 100.

Methods for writing data to magnetic memory cell array 200 will be described in detail below. In general, however, each word line 204 applies a magnetic field $H_{word}$ along a y-axis of each magnetic memory cell 100, and each bit line 202 applies a magnetic field $H_{bit}$ along an x-axis of each magnetic memory cell 100. The y-axis comprises a hard switching axis of each magnetic memory cell 100 and the x-axis comprises an easy switching axis of each magnetic memory cell 100.

Figure 3A:
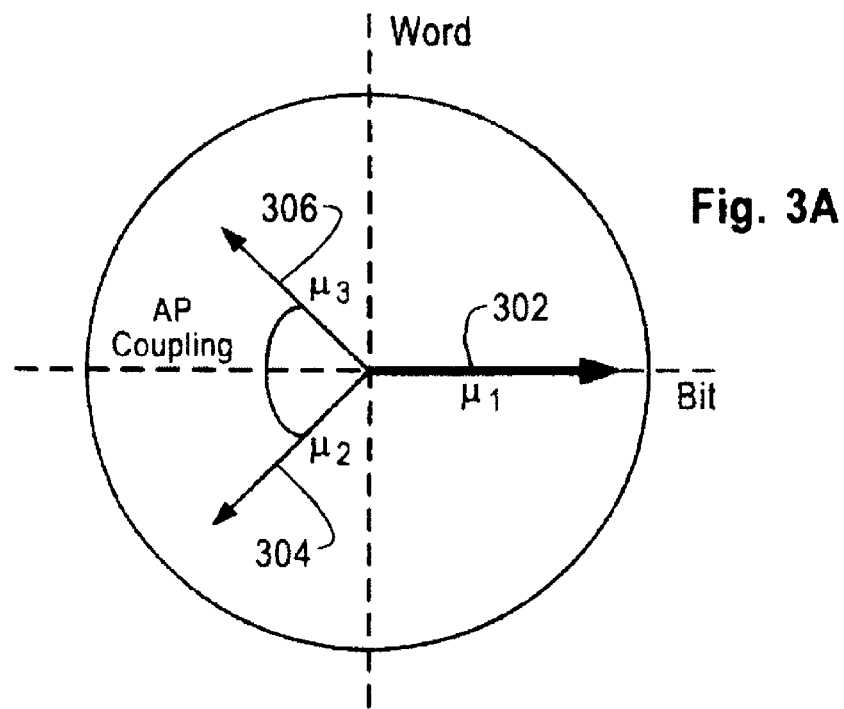
FIGS. 3A-B are diagrams illustrating top-down views of stable magnetic states of the exemplary magnetic memory cell of FIG. 1 in a zero applied magnetic field according to an embodiment of the present invention.
Figure 3B:
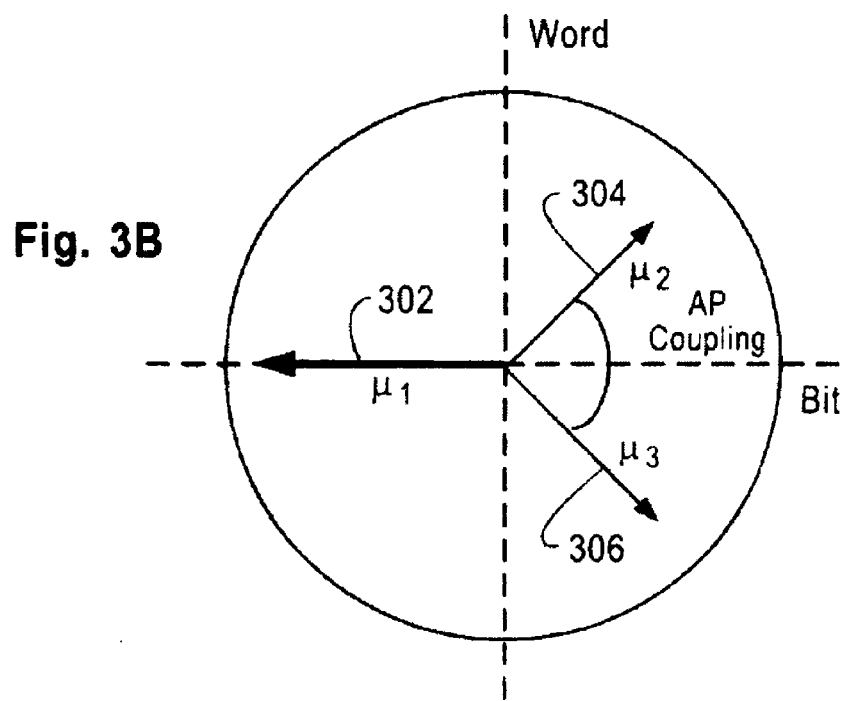

FIGS. 3A-B are diagrams illustrating top-down views of stable magnetic states of exemplary magnetic memory cell 100 in a zero applied magnetic field. Arrows 302, 304 and 306 represent magnetic moments $\mu_1$, $\mu_2$ and $\mu_3$ of magnetic layers 108, 112 and 116, respectively. Since $\mu_1 > \mu_2$ and $\mu_1 > \mu_3$, as described above, a heavier arrow is used for arrow 302 than for arrows 304 and 306. According to the present teachings, at least magnetic layer 108 will have an intrinsic anisotropy set along the x-axis direction (i.e., along the easy switching axis). Further, by virtue of the fact that $\mu_1 > \mu_2$ and $\mu_1 > \mu_3$, $\mu_1$ will point along the intrinsic anisotropy axis of magnetic layer 108. As such, there are two stable magnetic states for magnetic memory cell 100 when in a zero applied magnetic field. The first stable magnetic state is when $\mu_1$ points in the positive x-axis direction. See, for example, FIG. 3A wherein arrow 302 is pointing to the right. The second stable magnetic state is when $\mu_1$ points in the negative x-axis direction. See, for example, FIG. 3B wherein arrow 302 is pointing to the left.

The dipole fields from each of magnetic layers 108, 112 and 116 make $\mu_1$, $\mu_2$ and $\mu_3$ spread out in a triangle. See FIGS. 3A-B wherein arrows 302, 304 and 306 spread out in a triangle.

As shown in FIG. 3A, when arrow 302 ($\mu_1$) points to the right, arrow 304 ($\mu_2$) points to the lower left and arrow 306 ($\mu_3$) points to the upper left. Similarly, as shown in FIG. 3B, when arrow 302 ($\mu_1$) points to the left, arrow 304 ($\mu_2$) points to the upper right and arrow 306 ($\mu_3$) points to the lower right.

It is notable that in the two stable magnetic states shown in FIGS. 3A and 3B, it is immaterial which of $\mu_2$ or $\mu_3$ points to the upper/lower left/right, respectively. For example, the operation of magnetic memory cell 100 would not change if in the configuration shown in FIG. 3B arrow 304 ($\mu_2$) pointed to the lower right instead of the upper right and arrow 306 ($\mu_3$) pointed to the upper right instead of the lower right.

Figure 4:
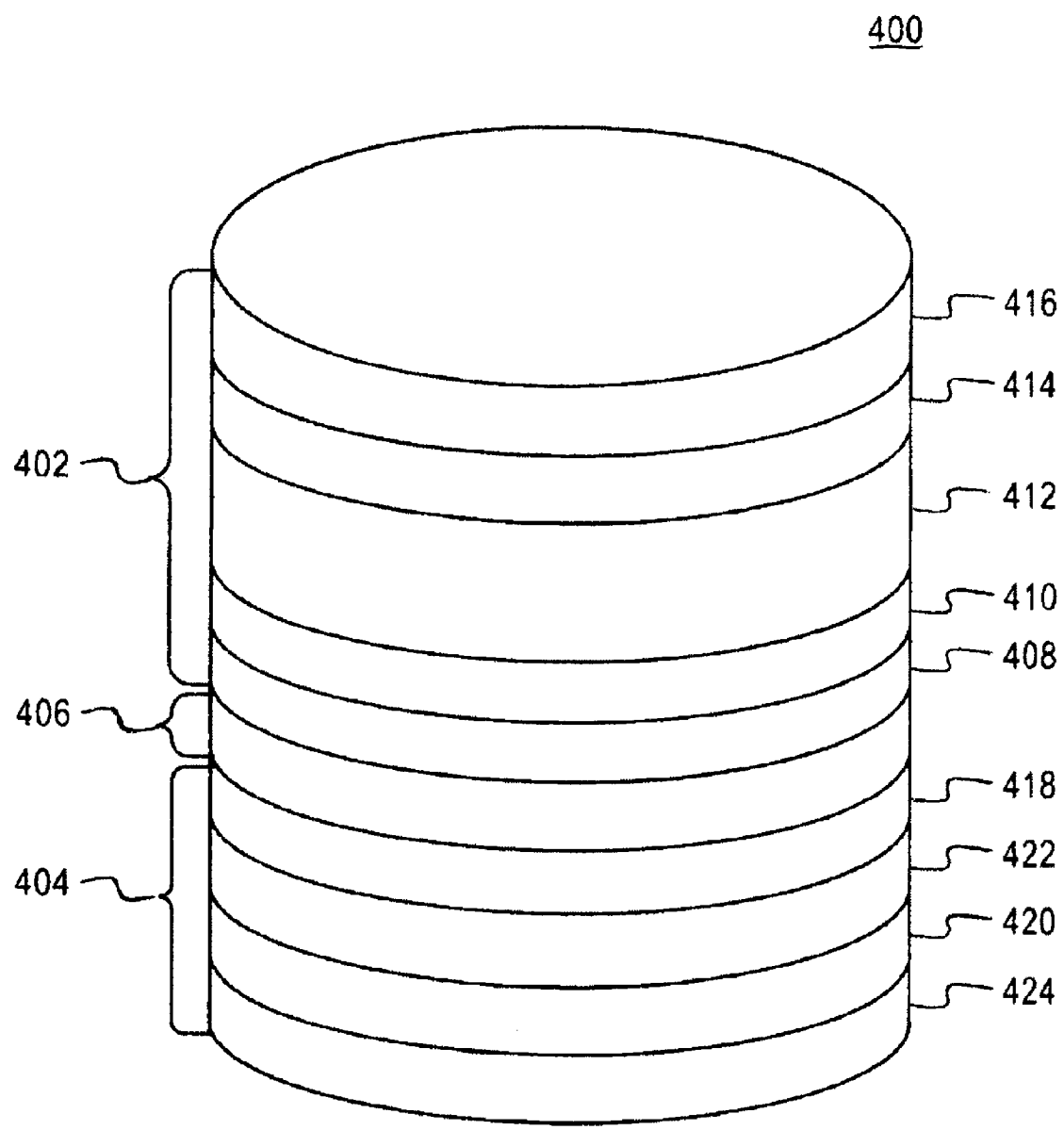
FIG. 4 is a diagram illustrating another exemplary magnetic memory cell according to an embodiment of the present invention.

FIG. 4 is a diagram illustrating exemplary magnetic memory cell 400. Magnetic memory cell 400 comprises tunnel barrier 406 deposited on fixed layer 404, and free layer 402 deposited on tunnel barrier 406.

Free layer 402 is a multiple-layer structure. Namely, free layer 402 includes three magnetic layers 408, 412 and 416, each of which can comprise a ferromagnetic material, including, but not limited to, one or more of a NiFe alloy and alloys containing one or more of Ni, Fe, Co and a rare earth element. Further, any one of magnetic layers 408, 412 and 416 can have a same, or a different, composition as any one of the other magnetic layers 408, 412 and 416.

Magnetic layer 412 is separated from, and is parallel coupled (P-coupled) to both magnetic layers 408 and 416 by P-coupling layers 410 and 414, respectively. Each of P-coupling layers 410 and 414 can comprise any suitable P-coupling materials, including, but not limited to, one or more of Ru, Os, Cu, Cr, Mo, Rh, Re and Ir, and may have a same, or a different, composition as each other.

Each of magnetic layers 408, 412 and 416 has a magnetic moment $\mu$ associated therewith. The value of $\mu$ can be calculated according to Equation 1, above. Magnetic layers 408, 412 and 416 have magnetic moments $\mu_4$, $\mu_5$ and $\mu_6$, respectively, associated therewith. According to the present teachings, $\mu_5$ is greater than $\mu_4$ and $\mu_6$, i.e., $\mu_5 > \mu_4$ and $\mu_5 > \mu_6$. Further, according to one exemplary embodiment, $\mu_4$ is equal to $\mu_6$, i.e., $\mu_4 = \mu_6$. As described in detail above, if magnetic layers 408, 412 and 416 occupy the same area A and have the same magnetization $M_s$, then layer thickness T is the sole variable in moment $\mu$ differences between the magnetic layers. Such an instance is depicted in FIG. 4, wherein magnetic layer 412 is shown to have a greater thickness than either of magnetic layers 408 and 416.

Fixed layer 404 is a multiple-layer structure. Namely fixed layer 404 comprises magnetic layer 418 adjacent to tunnel barrier 406 and separated from magnetic layer 420 by AP-coupling layer 422. AF layer 424 is adjacent to a side of magnetic layer 420 opposite AP-coupling layer 422. Magnetic layers 418 and 420 can have a same, or a different, composition as each other, and can comprise any suitable ferromagnetic material, including, but not limited to, one or more of a NiFe alloy and alloys containing one or more of Ni, Fe, Co and a rare earth element. AP-coupling layer 422 mediates anti-parallel magnetic coupling between magnetic layers 418 and 420 and can comprise one or more of Ru, Os, Cu, Cr, Mo, Rh, Re and Ir.

AF layer 424 serves to pin the direction of magnetization of magnetic layers 418 and 420. AF layer 424 can comprise a metal alloy, including, but not limited to, one or more of a PtMn alloy and an IrMn alloy.

A plurality of magnetic memory cells 400 may be used in a magnetic memory cell array. For example, a plurality of magnetic memory cells 400 can be used in magnetic memory cell array 200, described in conjunction with the description of FIG. 2 above, in place of magnetic memory cells 100.

Figure 5A:
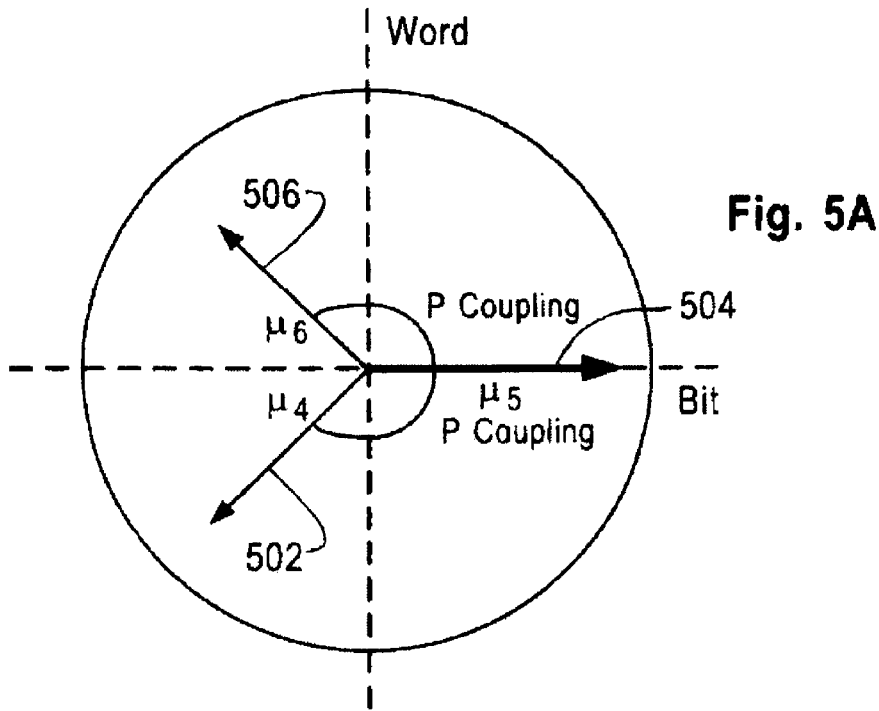
FIGS. 5A-B are diagrams illustrating top-down views of stable magnetic states of the exemplary magnetic memory cell of FIG. 4 in a zero applied magnetic field according to an embodiment of the present invention.
Figure 5B:
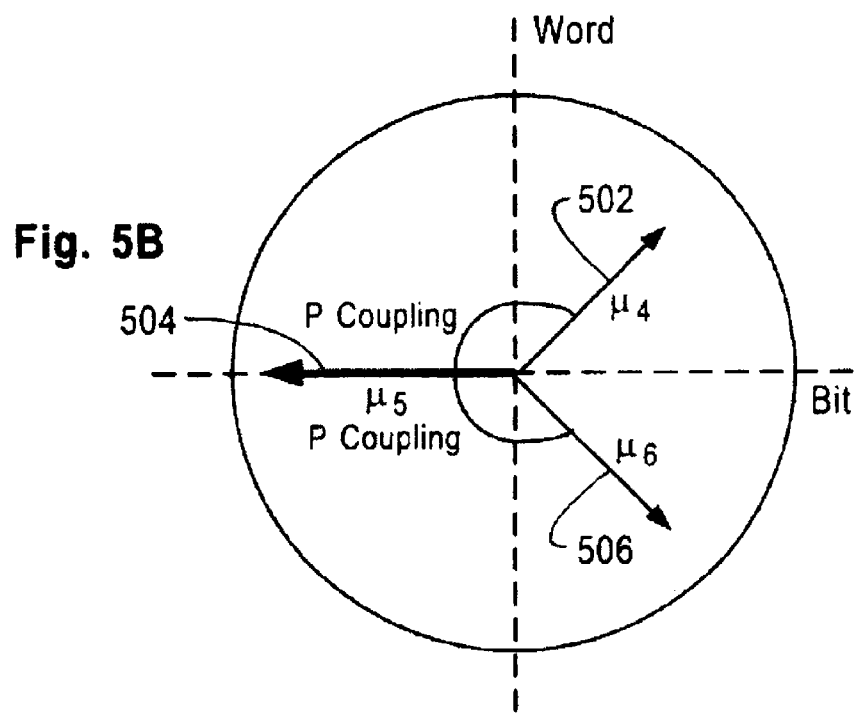

FIGS. 5A-B are diagrams illustrating top-down views of stable magnetic states of exemplary magnetic memory cell 400 in a zero applied magnetic field. Arrows 502, 504 and 506 represent magnetic moments $\mu_4$, $\mu_5$ and $\mu_6$ of magnetic layers 408, 412 and 416, respectively. Since $\mu_5 > \mu_4$ and $\mu_5 > \mu_6$, as described above, a heavier arrow is used for arrow 504 than for arrows 502 and 506. According to the present teachings, at least magnetic layer 412 will have an intrinsic anisotropy set along the x-axis direction (i.e., along the easy switching axis). Further, by virtue of the fact that $\mu_5 > \mu_4$ and $\mu_5 > \mu_6$, $\mu_5$ will point along the intrinsic anisotropy axis of magnetic layer 412. As such, there are two stable magnetic states for magnetic memory cell 400 in a zero applied magnetic field. The first stable magnetic state is when $\mu_5$ points in the positive x-axis direction. See, for example, FIG. 5A wherein arrow 504 points to the right. The second stable magnetic state is when $\mu_5$ points in the negative x-axis direction. See, for example, FIG. 5B wherein arrow 504 is pointing to the left.

As shown in FIG. 5A, when arrow 504 ($\mu_5$) points to the right, arrow 502 ($\mu_4$) points to the lower left and arrow 506 ($\mu_6$) points to the upper left. Similarly, as shown in FIG. 5B, when arrow 504 ($\mu_5$) points to the left, arrow 502 ($\mu_4$) points to the upper right and arrow 506 ($\mu_6$) points to the lower right. As explained above, in FIGS. 5A-B it is immaterial which of $\mu_4$ or $\mu_6$ points to the upper/lower left/right, respectively.

Figure 6:
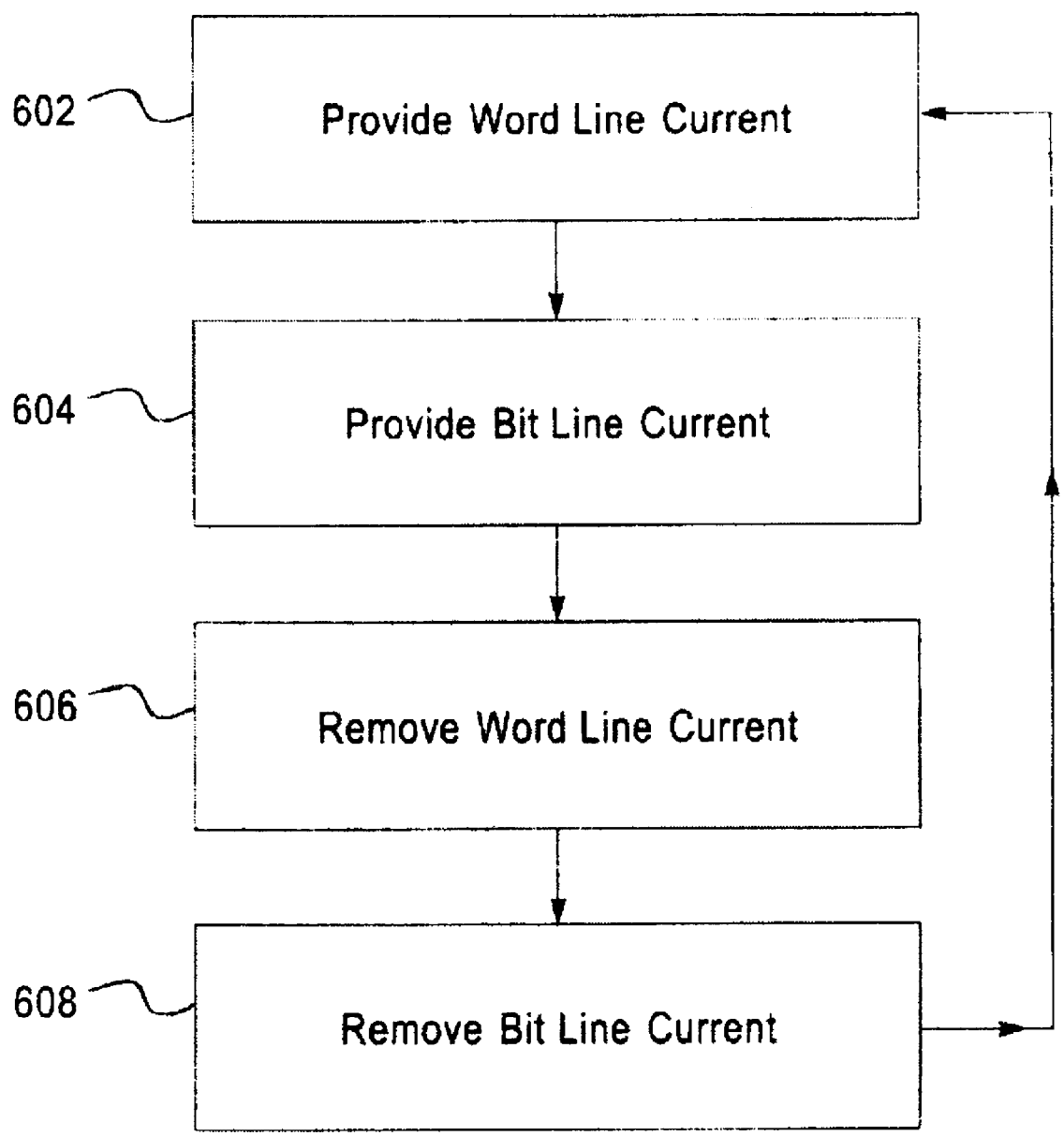
FIG. 6 is a diagram illustrating an exemplary methodology for writing data to a magnetic memory cell array according to an embodiment of the present invention.

FIG. 6 is a diagram illustrating exemplary methodology 600 for writing data to a magnetic memory cell array, such as magnetic memory cell array 200, described in conjunction with the description of FIG. 2, above, having a plurality of word lines oriented orthogonal to a plurality of bit lines and a plurality of magnetic memory cells (e.g., magnetic memory cells 100 or magnetic memory cells 400, both described above) therebetween. As described above, in each magnetic memory cell in the array, the free magnetic layer having the greatest moment $\mu$ has an intrinsic anisotropy pointing along the x-axis direction and thus aligned with the direction of field applied by the bit line.

In step 602, a current is passed along a given one of the word lines (a word line current) thereby selecting all of the magnetic memory cells on that given word line (i.e., the word line current destabilizes the magnetic memory cells, which essentially erases all pre-existing data and makes the magnetic memory cells easier to write). Namely, all of the magnetic memory cells on that given word line are selected to be written together at the same time. According to one exemplary embodiment, there are 128 magnetic memory cells per word line.

In step 604, each of the magnetic memory cells selected in step 602, above, is written by sending a small current through each corresponding bit line (a bit line current). For example, if 128 magnetic memory cells are selected in step 602 above, then a bit line current is sent through each of the 128 corresponding bit lines to write data to those 128 magnetic memory cells.

The bit line current can be either a positive current or a negative current. A positive current will write a logic "1" to the corresponding magnetic memory cell, and a negative current will write a logic "0" to the corresponding magnetic memory cell.

In step 606, the word line current is removed. In step 608, the bit line current is removed. As a result, data (i.e., either a logic "1" or a logic "0") is written to each of the magnetic memory cells selected in step 602, above.

Figure 7A:
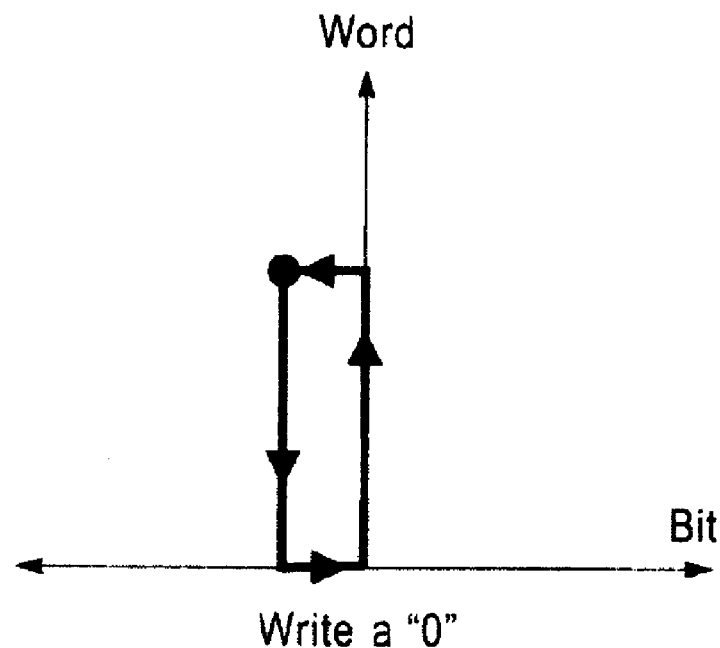
FIGS. 7A-B are graphs representing current pulse sequences used to write data to an individual magnetic memory cell according to an embodiment of the present invention.
Figure 7B:
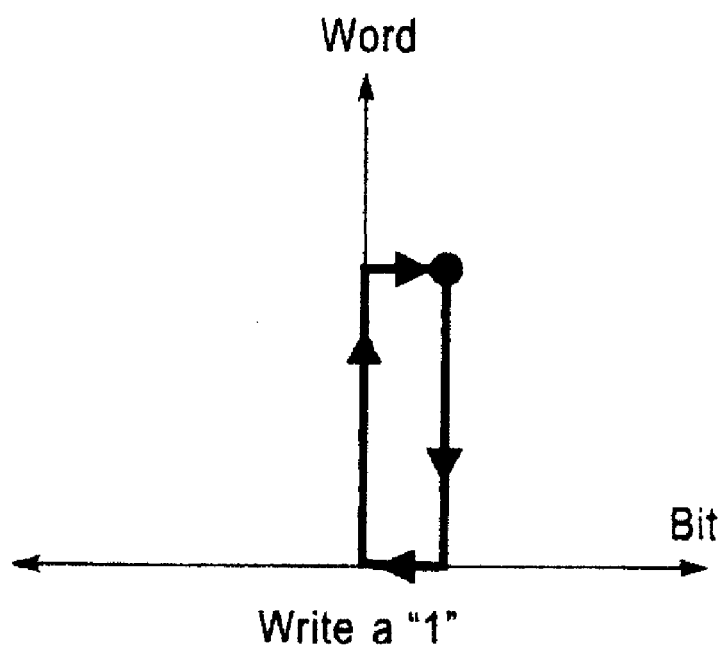

FIGS. 7A-B are graphs representing current pulse sequences used to write data to an individual magnetic memory cell. Specifically, FIG. 7A illustrates the current pulse sequence used to write a logic "0" to a magnetic memory cell, and FIG. 7B illustrates the current pulse sequence used to write a logic "1" to a magnetic memory cell. The arrows in FIGS. 7A and 7B represent the current pulses.

Referring to FIG. 7A, the sequence starts with the magnetic memory cell being in a zero applied magnetic field. As described in conjunction with the description of FIG. 6, above, a current is first applied to the word line, i.e., the word line is turned on. In this instance, a negative current is then applied to the bit line, i.e., the bit line is turned on. The current to the word line is then removed, i.e., the word line is turned off, followed by the current to the bit line being removed, i.e., the bit line is turned off. As a result, a logic "0" will have been written to the magnetic memory cell.

Referring to FIG. 7B, the sequence again starts with the magnetic memory cell being in a zero applied magnetic field. The word line is first turned on, followed by the bit line. In this instance, however, a positive current is applied to the bit line. The word line is then turned off, followed by the bit line being turned off. As a result, a logic "1" will have been written to the magnetic memory cell.

Figure 8:
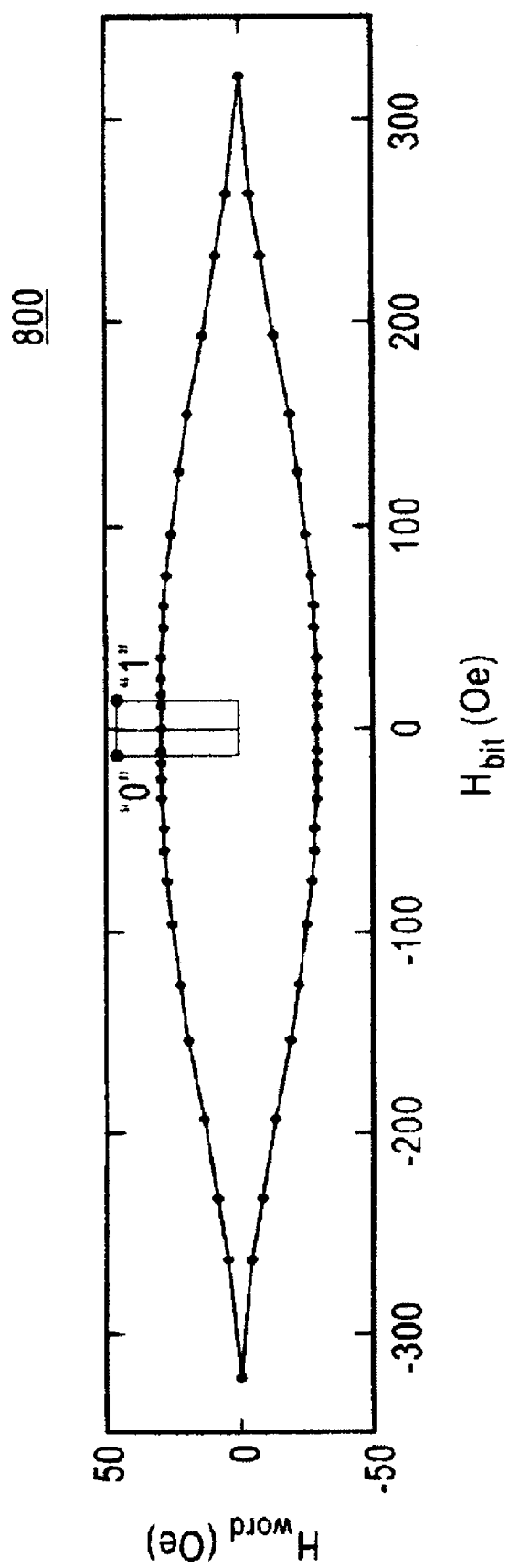
FIG. 8 is a graph illustrating an exemplary critical switching curve for a magnetic memory cell according to an embodiment of the present invention.

FIG. 8 is a graph illustrating critical switching curve 800 for magnetic memory cell 100. The values of $H_{bit}$ and $H_{word}$ are presented in Oersteds (Oe). Switching curve 800 is analogous to the common Stoner-Wohlfarth astroid.

For magnetic fields inside curve 800, magnetic memory cell 100 is stable. For magnetic fields outside of curve 800, magnetic memory cell 100 can be written.

Switching curve 800 was calculated with a single domain model using the following parameters for magnetic memory cell 100. Magnetic layer 108 has a thickness of six nanometers (nm); magnetic layer 112 has a thickness of five nm; and magnetic layer 116 has a thickness of five nm. Each of magnetic layers 108, 112 and 116 has a $M_s$ equal to 1,500 electromagnetic units/cubic centimeter (emu/cc), an intrinsic anisotropy $H_i$ of 25 Oe, and a diameter of 150 nm. The exchange coupling J between magnetic layers 112 and 116 equals $-0.05$ erg/square centimeter (erg/cm$^2$), wherein a negative J value denotes AP-coupling.

From switching curve 800 it is notable that the bit and word line fields, e.g., $H_{bit}$ and $H_{word}$, respectively, required to write magnetic memory cell 100 are very small, for example, less than 50 Oe for the word line (which, as described above, may be distributed over 128 magnetic memory cells per word line), and less than 10 Oe for the bit line. Thus, for an exemplary array having 128 magnetic memory cells per word line, the total field per magnetic memory cell is 10+50/128~10 Oe.

By comparison, for toggle switching devices, such as those described in Savtchenko, one needs $H_{bit}=H_{word}=80$ Oe. Thus, the total field per toggle switching device is 80+80/128=81 Oe. Therefore, magnetic memory cell 100 uses eight times less power than a typical toggle switching device.

Another important feature of magnetic memory cell 100 is that when $H_{word}$ is zero, a very large bit line field is required to switch magnetic memory cell 100. See, for example, switching curve 800 wherein an $H_{bit}$ of greater than 300 Oe is needed to switch magnetic memory cell 100 when $H_{word}$ is zero. Thus, magnetic memory cell 100 is very stable under half select. It is only when the word line is selected that it is then easy to write magnetic memory cell 100 with a small bit line field, as described above.

Figure 9A:
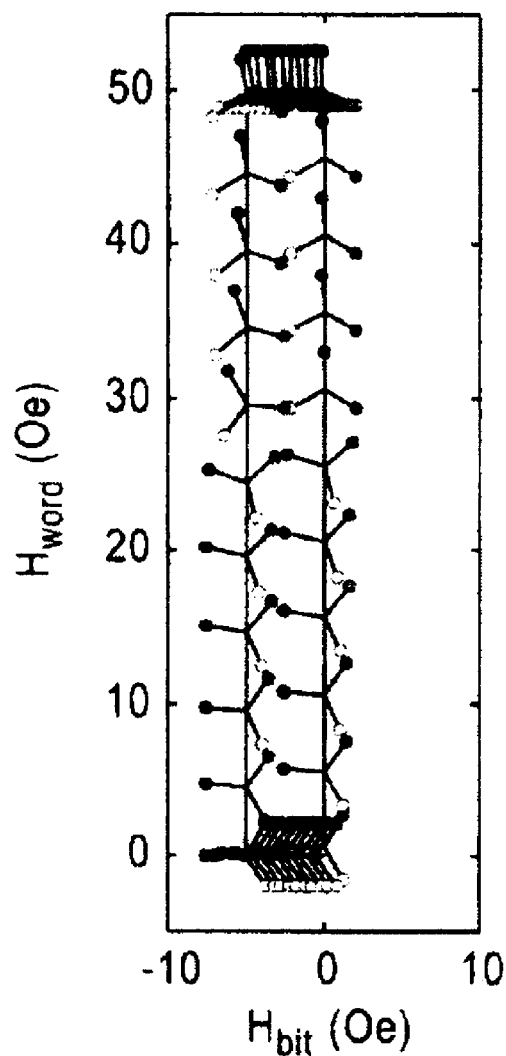
FIGS. 9A-D are graphs illustrating magnetic moment rotations in magnetic layers of a magnetic memory cell according to an embodiment of the present invention.
Figure 9B:
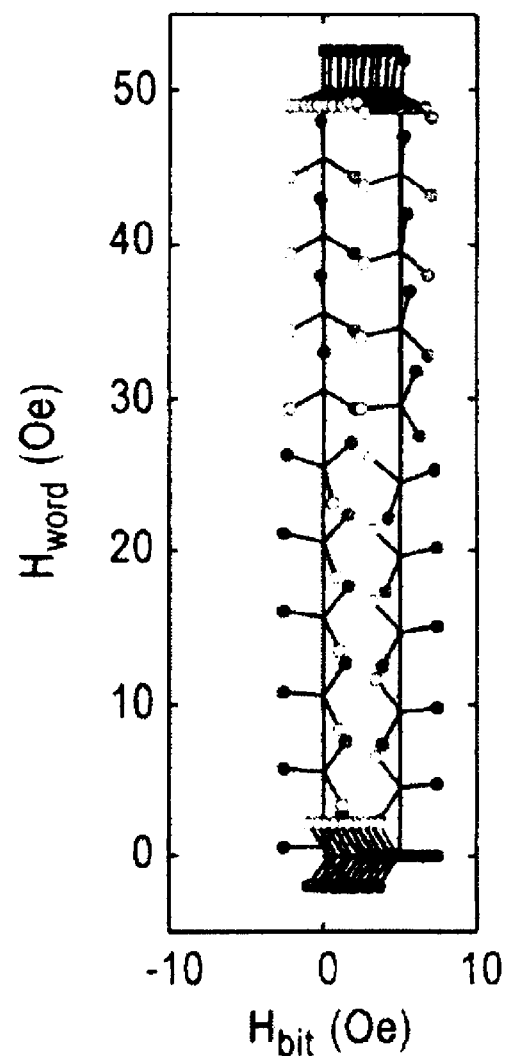
Figure 9C:
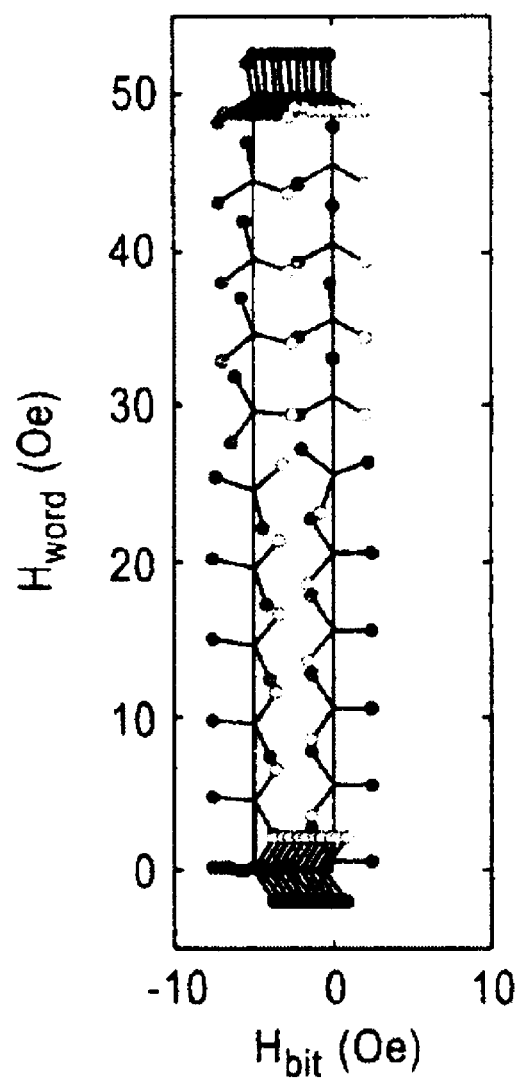
Figure 9D:
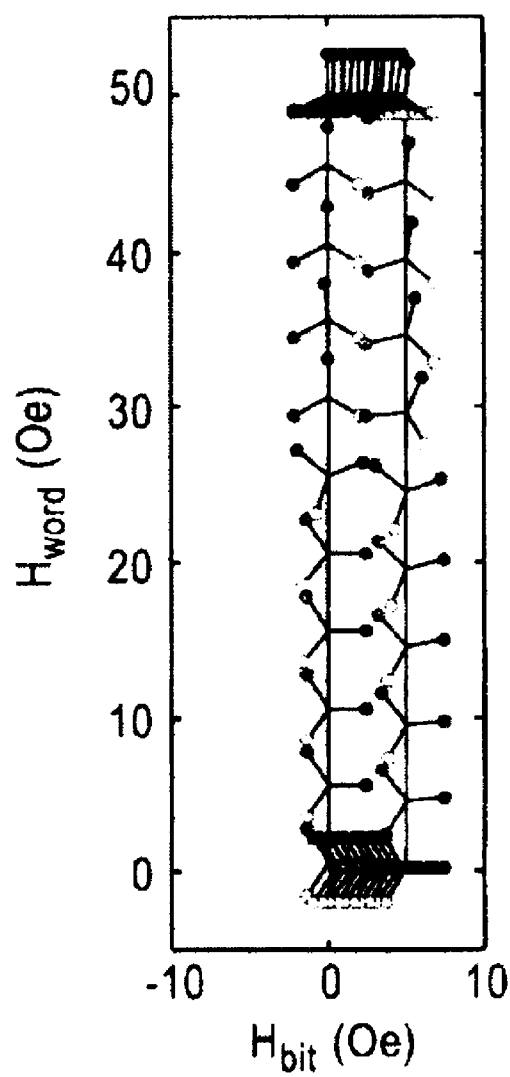

FIGS. 9A-D are graphs illustrating magnetic moment rotations in magnetic layers 108, 112 and 116 of magnetic memory cell 100. Specifically, in FIGS. 9A and 9B, the rotations of magnetic moments $\mu_1$, $\mu_2$, and $\mu_3$ in magnetic layers 108, 112 and 116, respectively, are depicted when magnetic memory cell 100 starts in a "0" logic state, and a logic "0" or a logic "1," respectively, is written. In FIGS. 9C and 9D, the rotations of magnetic moments $\mu_1$, $\mu_2$, and $\mu_3$ in magnetic layers 108, 112 and 116, respectively, are depicted when magnetic memory cell 100 starts in a "1" logic state, and a logic "0" or a logic "1," respectively, is written. In each of FIGS. 9A-D, $\mu_1$ corresponding to magnetic layer 108 is depicted as a line ending in a black circle, $\mu_2$ corresponding to magnetic layer 112 is depicted as a line ending in a gray circle and $\mu_3$ corresponding to magnetic layer 116 is depicted as a line ending in a white circle. Circles have been used for ease of depiction and identification of each magnetic moment with the corresponding magnetic layer. However, it is to be understood that each circle can be replaced with an arrowhead, e.g., as in FIGS. 3A-B, described above wherein $\mu_1$, $\mu_2$, and $\mu_3$ are represented by arrows 302, 304 and 306, respectively.

The graphs shown in FIGS. 9A-D were all calculated with a single domain theory, using the same parameter values as in switching curve 800, above. Namely, magnetic layer 108 has a thickness of six nm; magnetic layer 112 has a thickness of five nm; and magnetic layer 116 has a thickness of five nm. Each of magnetic layers 108, 112 and 116 has a $M_s$ equal to 1,500 emu/cc, an $H_i$ of 25 Oe, and a diameter of 150 nm. Finally, the exchange coupling J between magnetic layers 112 and 116 equals $-0.05$ erg/cm$^2$, wherein a negative J value denotes AP-coupling.

In FIG. 9A, as mentioned above, magnetic memory cell 100 starts in a "0" logic state, and a logic "0" is written. According to this exemplary embodiment, $\mu_1$ initially points to the left in the zero applied magnetic field. As described above, when $\mu_1$ points to the left in a zero applied magnetic field, magnetic memory cell 100 registers a logic "0." Beginning at the point of zero applied magnetic field, a current pulse sequence then occurs.

First, a 50 Oe word line field is applied. As the word line field is applied, $\mu_1$ rotates up to point along the hard axis direction. A small negative bit line field is then applied. This negative bit line field rotates $\mu_1$ slightly to the left. As the word line field is then decreased, the negative bit line field keeps $\mu_1$ biased to the left, so that when $H_{word}$ has been decreased to zero again, $\mu_1$ points to the left. $\mu_1$ stays pointing to the left as the bit line field is reduced to zero.

In FIG. 9B, as mentioned above, magnetic memory cell 100 starts in a "0" logic state, and a logic "1" is written. According to this exemplary embodiment, $\mu_1$ initially points to the left in the zero applied magnetic field. As described above, when $\mu_1$ points to the left in a zero applied magnetic field, magnetic memory cell 100 registers a logic "0." As above, beginning at the point of zero applied magnetic field, a current pulse sequence then occurs.

First, a 50 Oe word line field is applied. As the word line field is applied, $\mu_1$ rotates up to point along the hard axis direction. A small positive bit line field is then applied. This positive bit line field rotates $\mu_1$ slightly to the right. As the word line field is then decreased, the positive bit line field keeps $\mu_1$ biased to the right, so that when $H_{word}$ has been decreased to zero again, $\mu_1$ points to the right. $\mu_1$ stays pointing to the right as the bit line field is reduced to zero.

In FIG. 9C, as mentioned above, magnetic memory cell 100 starts in a "1" logic state, and a logic "0" is written. According to this exemplary embodiment, $\mu_1$ initially points to the right in a zero applied magnetic field. As described above, when $\mu_1$ points to the right in a zero applied magnetic field, magnetic memory cell 100 registers a logic "1." As above, beginning at the point of zero applied magnetic, a current pulse sequence then occurs.

First, a 50 Oe word line field is applied. As the word line field is applied, $\mu_1$ rotates up to point along the hard axis direction. A small negative bit line field is then applied. This negative bit line field rotates $\mu_1$ slightly to the left. As the word line field is then decreased, the negative bit line field keeps $\mu_1$ biased to the left, so that when $H_{word}$ has been decreased to zero again, $\mu_1$ points to the left. $\mu_1$ stays pointing to the left as the bit line field is reduced to zero.

In FIG. 9D, as mentioned above, magnetic memory cell 100 starts in a "1" logic state, and a logic "1" is written. According to this exemplary embodiment, $\mu_1$ initially points to the right in a zero applied magnetic field. As described above, when $\mu_1$ points to the right in a zero applied magnetic field, magnetic memory cell 100 registers a logic "1." As above, beginning at the point of zero applied magnetic field, a current pulse sequence then occurs.

First, a 50 Oe word line field is applied. As the word line field is applied, $\mu_1$ rotates up to point along the hard axis direction. A small positive bit line field is then applied. This positive bit line field rotates $\mu_1$ slightly to the right. As the word line field is then decreased, the positive bit line field keeps $\mu_1$ biased to the right, so that when $H_{word}$ has been decreased to zero again, $\mu_1$ points to the right. $\mu_1$ stays pointing to the right as the bit line field is reduced to zero.

In general, the three moments $\mu_1$, $\mu_2$, and $\mu_3$ bodily rotate together, largely maintaining their original triangular relative orientation. The purpose of the AP-coupling between magnetic layers 112 and 116 is to promote this bodily rotation.

Thus, in conclusion, when magnetic memory cell 100 starts in either a "0" or "1" logic state, a word line field followed by a small negative bit line field will write a logic "0." Similarly, when magnetic memory cell 100 starts in either a "0" or "1" logic state, a word line field followed by a small positive bit line field will write a logic "1."

Figure 10A:
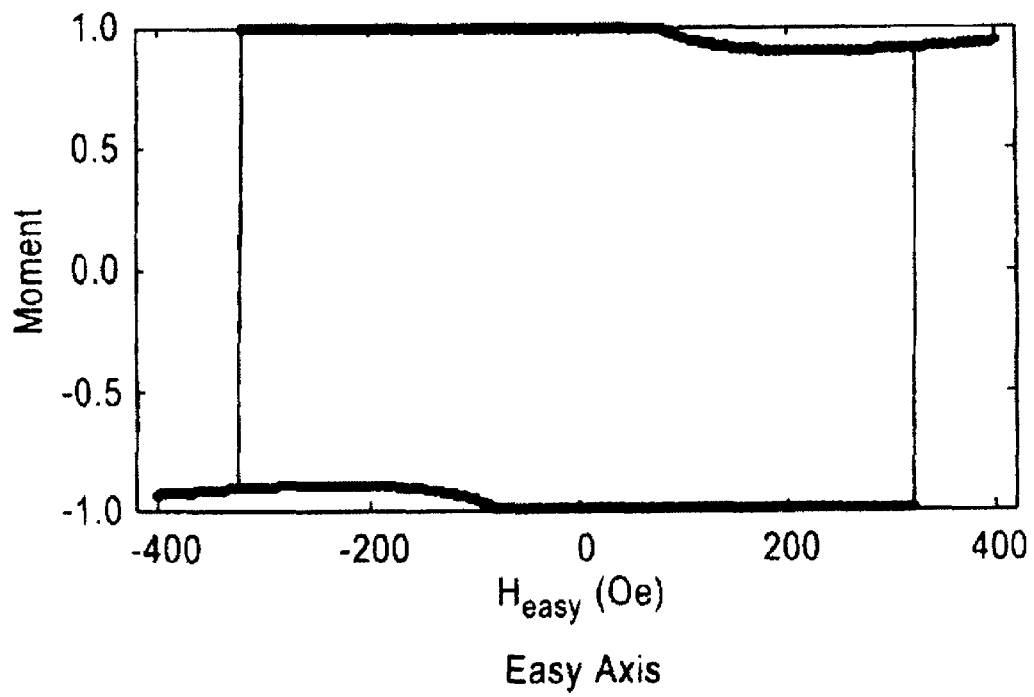
FIGS. 10A-B are graphs illustrating moment rotations for a magnetic memory cell when a field is applied in an easy axis direction according to an embodiment of the present invention.
Figure 10B:
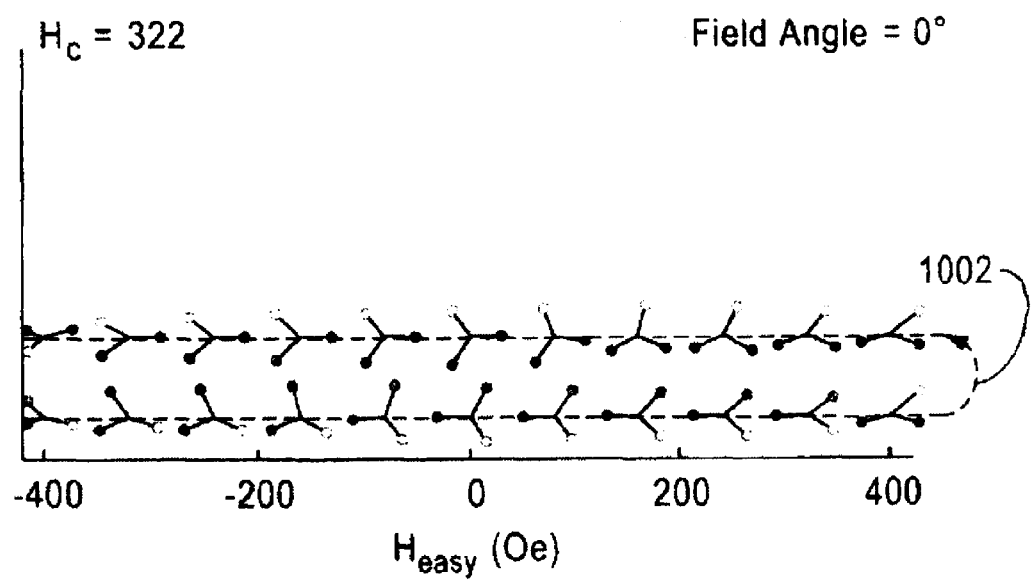

FIGS. 10A-B are graphs illustrating moment rotations for magnetic memory cell 100 when a field is applied in the easy axis direction. Specifically, FIG. 10A is a hysteresis graph illustrating magnetic moment $\mu_1$ of magnetic layer 108 (normalized to 1) in the easy axis direction and FIG. 10B is a graph illustrating the rotations of magnetic moments $\mu_1$, $\mu_2$, and $\mu_3$ in magnetic layers 108, 112 and 116, respectively, when a field is applied in the easy axis direction. In FIG. 10A, the magnetic field applied by the easy axis ($H_{easy}$) is plotted on the x-axis and the component of $\mu_1$ along the easy axis (normalized to 1) is plotted on the y-axis. In FIG. 10B, $H_{easy}$ is again plotted on the x-axis and the directions of the moments corresponding to magnetic layers 108, 112 and 116 are shown. As with FIGS. 9A-D, described above, in FIG. 10B, $\mu_1$ corresponding to magnetic layer 108 is depicted as a line ending in a black circle, $\mu_2$ corresponding to magnetic layer 112 is depicted as a line ending in a gray circle and $\mu_3$ corresponding to magnetic layer 116 is depicted as a line ending in a white circle. Circles have been used for ease of depiction and identification of each magnetic moment with the corresponding magnetic layer. However, it is to be understood that each circle can be replaced with an arrowhead, e.g., as in FIGS. 3A-B, described above wherein $\mu_1$, $\mu_2$, and $\mu_3$ are represented by arrows 302, 304 and 306, respectively.

The progression of the magnetic moment rotations occurs in the sequence indicated by arrow 1002. For example, starting at $H_{easy}$ equals −400 Oe and following the sequence indicated by arrow 1002, it is shown that $\mu_1$ starts pointing to the left, and subsequently flips to pointing to the right, near +400 Oe, and then as the field is reversed the moment initially stays pointing to the right and then flips to pointing to the left near −400 Oe.

The graphs in FIGS. 10A-B were all calculated with a single domain theory, using the same parameter values as in, for example, switching curve 800, above. Namely, magnetic layer 108 has a thickness of six nm; magnetic layer 112 has a thickness of five nm; and magnetic layer 116 has a thickness of five nm. Each of magnetic layers 108, 112 and 116 has a $M_s$ equal to 1,500 emu/cc, an $H_t$ of 25 Oe, and a diameter of 150 nm. Finally, the exchange coupling J between magnetic layers 112 and 116 equals −0.05 erg/cm$^2$, wherein a negative J value denotes AP-coupling.

As can be seen from FIGS. 10A-B, when a field is applied along the easy axis, magnetic layer 108 does not respond initially, and magnetic layers 112 and 116 become stabilized by the field. This is why such a large field is required to switch magnetic memory cell 100 when the field is applied along the easy axis.

Figure 11A:
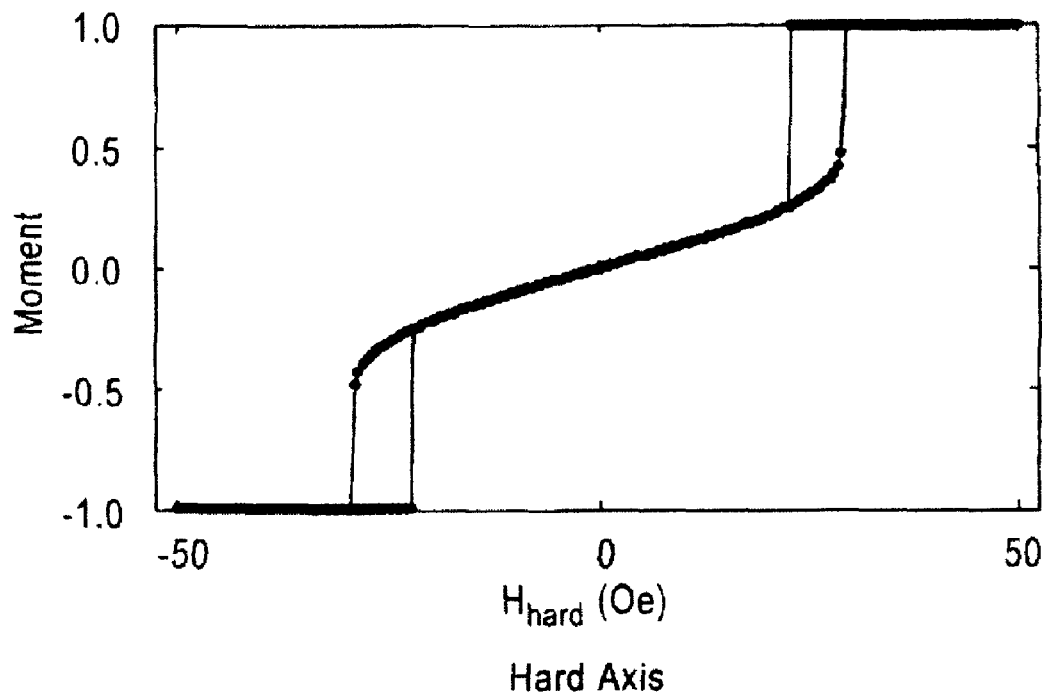
FIGS. 11A-B are graphs illustrating moment rotations for a magnetic memory cell when a field is applied in a hard axis direction according to an embodiment of the present invention.
Figure 11B:
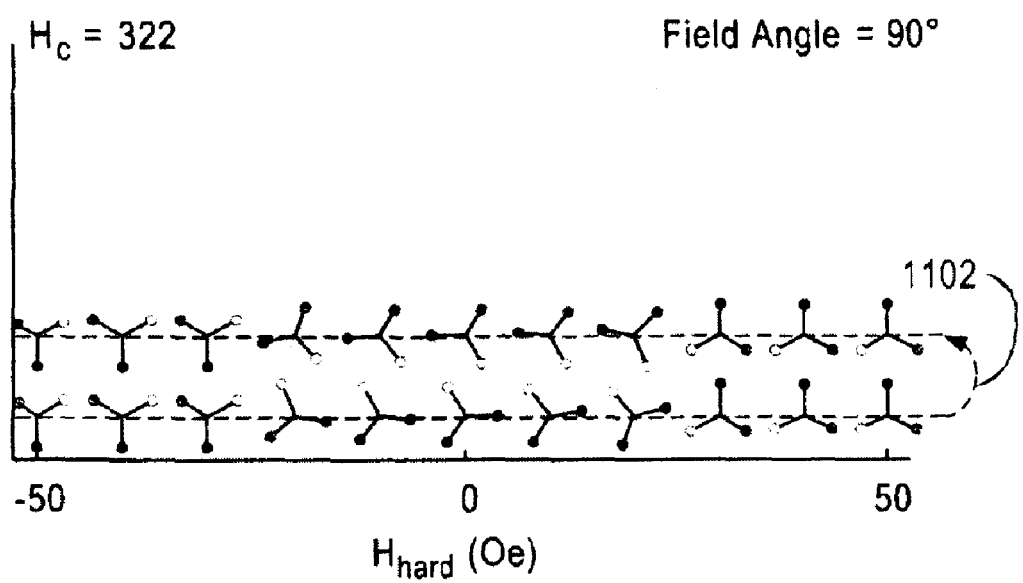

FIGS. 11A-B are graphs illustrating moment rotations for magnetic memory cell 100 when a field is applied in the hard axis direction. Specifically, FIG. 11A is a hysteresis graph illustrating magnetic moment $\mu_1$ of magnetic layer 108 (normalized to 1) in the hard axis direction, and FIG. 11B is a graph illustrating the rotations of magnetic moments $\mu_1$, $\mu_2$, and $\mu_3$ in magnetic layers 108, 112 and 116, respectively, when a field is applied in the hard axis direction. In FIG. 11A, the magnetic field applied by the hard axis ($H_{hard}$) is plotted on the x-axis and the component of $\mu_1$ in the hard axis direction (normalized to 1) is plotted on the y-axis. In FIG. 11B, $H_{hard}$ is again plotted on the x-axis and the directions of the moments corresponding to magnetic layers 108, 112 and 116 are shown. As with FIGS. 9A-D, described above, in FIG. 11B, $\mu_1$ corresponding to magnetic layer 108 is depicted as a line ending in a black circle, $\mu_2$ corresponding to magnetic layer 112 is depicted as a line ending in a gray circle and $\mu_3$ corresponding to magnetic layer 116 is depicted as a line ending in a white circle. Circles have been used for ease of depiction and identification of each magnetic moment with the corresponding magnetic layer. However, it is to be understood that each circle can be replaced with an arrowhead, e.g., as in FIGS. 3A-B, described above wherein $\mu_1$, $\mu_2$, and $\mu_3$ are represented by arrows 302, 304 and 306, respectively.

The progression of the magnetic moment rotations occurs in the sequence indicated by arrow 1102. For example, starting at $H_{hard}$ equals −50 Oe and following the sequence indicated by arrow 1102, it is shown that $\mu_1$ starts pointing down, and subsequently flips to pointing up, near +30 Oe, and then as the field is reversed the moment initially stays pointing up and then flips to pointing down near −30 Oe.

The graphs in FIGS. 11A-B were all calculated with a single domain theory, using the same parameter values as in, for example, switching curve 800, above. Namely, magnetic layer 108 has a thickness of six nm; magnetic layer 112 has a thickness of five nm; and magnetic layer 116 has a thickness of five nm. Each of magnetic layers 108, 112 and 116 has a $M_s$ equal to 1,500 emu/cc, an $H_t$ of 25 Oe, and a diameter of 150 nm. Finally, the exchange coupling J between magnetic layers 112 and 116 equals −0.05 erg/cm$^2$, wherein a negative J value denotes AP-coupling.

By way of comparison with FIGS. 10A-B, described above, as can be seen from FIGS. 11A-B, when a field is applied along the hard axis, moments 302, 304 and 306 bodily rotate so that magnetic layer 108 points in the direction of the applied field.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A magnetic memory cell comprising:
   at least one fixed magnetic layer; and
   a plurality of free magnetic layers, separated from the at least one fixed magnetic layer by at least one barrier layer, comprising:
   a first free magnetic layer adjacent to the barrier layer;
   a second free magnetic layer separated from the first free magnetic layer by at least one spacer layer; and
   a third free magnetic layer separated from the second free magnetic layer by at least one anti-parallel coupling layer,
   wherein a magnetic moment of the first free magnetic layer is greater than both a magnetic moment of the second free magnetic layer and a magnetic moment of the third free magnetic layer.

2. The magnetic memory cell of claim 1, wherein the at least one spacer layer is configured to prevent coupling between the first free magnetic layer and the second free magnetic layer.

3. The magnetic memory cell of claim 1, wherein the at least one anti-parallel coupling layer is configured to mediate anti-parallel coupling between the second free magnetic layer and the third free magnetic layer.

4. The magnetic memory cell of claim 1, wherein the magnetic moment of the second free magnetic layer equals the magnetic moment of the third free magnetic layer.

5. The magnetic memory cell of claim 1, wherein at least one of the first free magnetic layer, the second free magnetic layer and the third free magnetic layer comprise one or more of a nickel/iron alloy and alloys containing one or more of nickel, iron, cobalt and a rare earth element.

6. The magnetic memory cell of claim 1, wherein the first free magnetic layer, the second free magnetic layer and the third free magnetic layer have a same composition.

7. The magnetic memory cell of claim 1, wherein the at least one spacer layer comprises one or more of tantalum nitride, tantalum, titanium, tungsten and niobium.

8. The magnetic memory cell of claim 1, wherein the at least one anti-parallel coupling layer comprises one or more of ruthenium, osmium, copper, chromium, molybdenum, rhodium, rhenium and iridium.

9. The magnetic memory cell of claim 1, wherein a relative orientation of the magnetic moment of the first free magnetic layer, the magnetic moment of the second free magnetic layer and the magnetic moment of the third free magnetic layer is triangular in zero applied field.

10. The magnetic memory cell of claim 1, wherein the at least one fixed magnetic layer comprises:
    an anti-ferromagnetic layer;
    a first fixed magnetic layer adjacent to the anti-ferromagnetic layer; and
    a second fixed magnetic layer separated from the first fixed magnetic layer by at least one anti-parallel coupling layer.

11. The magnetic memory cell of claim 10, wherein the anti-ferromagnetic layer comprises one or more of a metal alloy, a platinum/manganese alloy and an iridium/manganese alloy.

12. A magnetic random access memory device, comprising:
- a plurality of word lines oriented orthogonal to a plurality of bit lines; and
- a plurality of magnetic memory cells configured in an array between the word lines and bit lines, at least one of the plurality of magnetic memory cells comprising:
  - at least one fixed magnetic layer; and
  - a plurality of free magnetic layers, separated from the at least one fixed magnetic layer by at least one barrier layer, comprising:
    - a first free magnetic layer adjacent to the barrier layer;
    - a second free magnetic layer separated from the first free magnetic layer by at least one spacer layer; and
    - a third free magnetic layer separated from the second free magnetic layer by at least one anti-parallel coupling layer,
    - wherein a magnetic moment of the first free magnetic layer is greater than both a magnetic moment of the second free magnetic layer and a magnetic moment of the third free magnetic layer.

13. The magnetic random access memory device of claim 12, wherein the first free magnetic layer has an intrinsic anisotropy set along a direction of magnetic field applied by the bit lines.

* * * * *